(12) United States Patent
Iyer et al.

(10) Patent No.: US 12,148,748 B2
(45) Date of Patent: Nov. 19, 2024

(54) ON-CHIP ELECTROSTATIC DISCHARGE SENSOR

(71) Applicant: The Regents of the University of California, Oakland, CA (US)

(72) Inventors: Subramanian Iyer, Los Angeles, CA (US); Kannan K. Thankappan, Los Angeles, CA (US); Boris Vaisband, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 35 days.

(21) Appl. No.: 17/332,931

(22) Filed: May 27, 2021

(65) Prior Publication Data
US 2022/0392893 A1 Dec. 8, 2022

Related U.S. Application Data
(60) Provisional application No. 63/030,702, filed on May 27, 2020.

(51) Int. Cl.
H01L 27/08 (2006.01)
G01R 31/00 (2006.01)
H01L 27/01 (2006.01)
H01L 49/02 (2006.01)

(52) U.S. Cl.
CPC ........ *H01L 27/0805* (2013.01); *G01R 31/002* (2013.01); *H01L 27/01* (2013.01); *H01L 28/40* (2013.01)

(58) Field of Classification Search
CPC ..... H01L 27/0805; H01L 27/01; H01L 28/40; H01L 27/0288; G01R 31/002; G01R 31/001; G01R 31/2856; G01R 31/2879
See application file for complete search history.

(56) References Cited

U.S. PATENT DOCUMENTS 8,183,593 B2 * 5/2012 Drost ............... H01L 27/0288
257/659
2019/0293692 A1 * 9/2019 Clarke .................. H01L 23/62

OTHER PUBLICATIONS

K. K.T., B. Vaisband and S. S. Iyer, "On-Chip ESD Monitor," 2019 IEEE 69th Electronic Components and Technology Conference (ECTC), Las Vegas, NV, USA, 2019, pp. 2225-2233, doi: 10.1109/ECTC.2019.00-13. (Date of conference May 28-31, 2019) (Year: 2019).*

* cited by examiner

Primary Examiner — John P. Dulka
(74) Attorney, Agent, or Firm — Foley & Lardner LLP

(57) ABSTRACT

Two approaches for on-chip ESD detection include variable dielectric width capacitor, and vertical metal-oxide-semiconductor (MOS) capacitor MOSCAP array. The variable dielectric width capacitor approach employs metal plates terminated with sharp corners to enhance local electric field and facilitate ready breakdown of a thin dielectric between the metal plates. The vertical MOSCAP array is composed of a capacitor array connected in series. Both approaches are incorporated in an example 22 nm fully depleted silicon-on-insulator. Vertical MOSCAP arrays detect ESD events starting from about 6 V with about 6 V granularity, while the variable dielectric width capacitor is suitable for detection of high ESD voltage from about 40 V and above.

7 Claims, 17 Drawing Sheets

ON-CHIP ELECTROSTATIC DISCHARGE SENSOR

CROSS-REFERENCE TO RELATED APPLICATIONS

Figure 1:
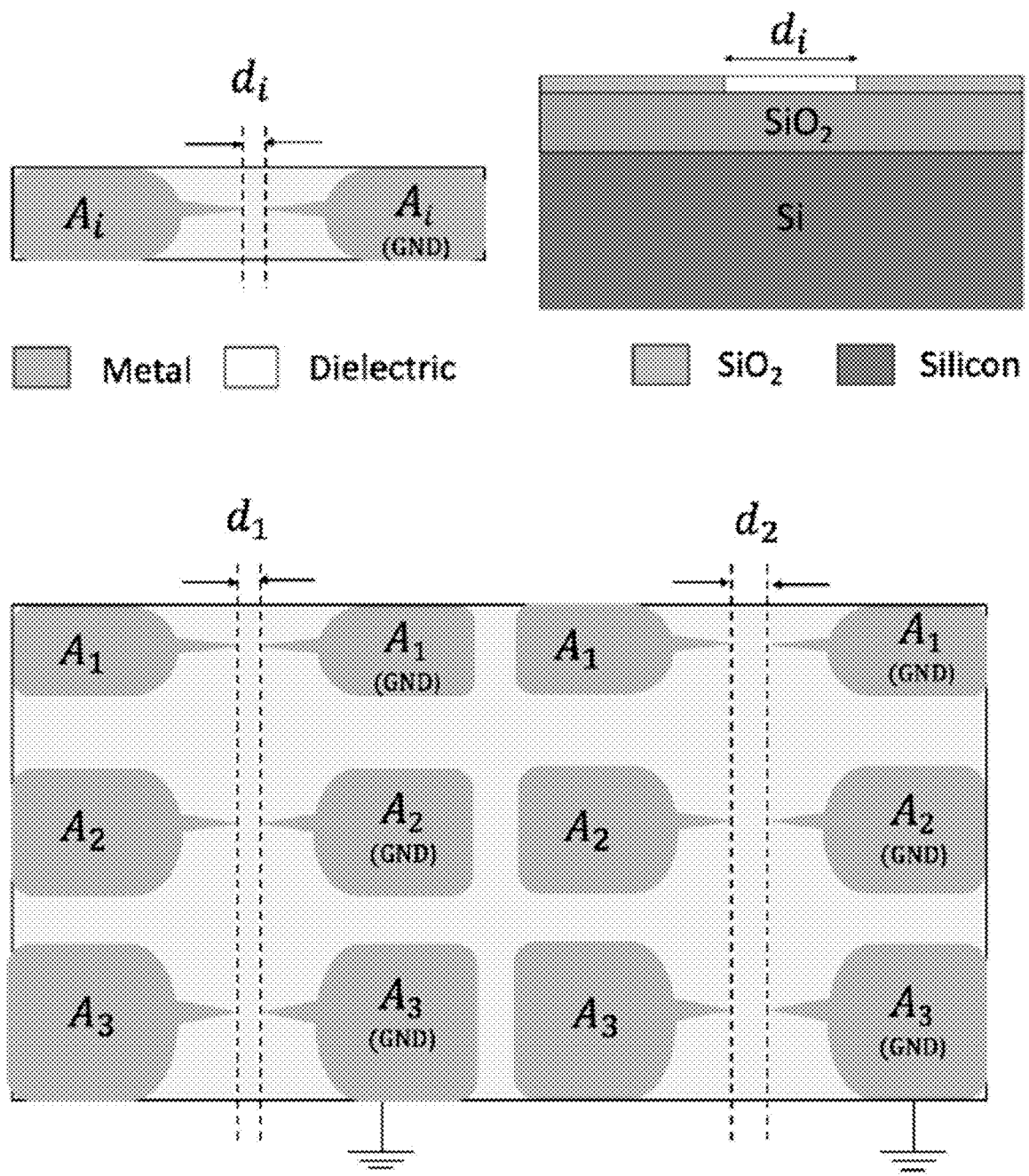

The present application claims priority to U.S. Provisional Patent Application No. 63/030,702 filed May 27, 2020, the contents of which are incorporated herein by reference in their entirety.

STATEMENT REGARDING FEDERALLY SPONSORED RESEARCH OR DEVELOPMENT

This invention was made with government support under Grant Number N66001-18-1-4040, awarded by the U.S. Department of Defense Advanced Research Projects Agency (DARPA). The government has certain rights in the invention.

SUMMARY

Electrostatic discharge (ESD) failure results in about 35% of integrated circuit (IC) field returns, and is the cause of several billion-dollar loss to the semiconductor industry. An on-chip ESD detector or sensor can help track the electrostatic history of ICs from manufacturing to end-of-life. In some embodiments, two approaches for on-chip ESD detection are presented: variable dielectric width capacitor, and vertical metal-oxide-semiconductor (MOS) capacitor MOSCAP array. The variable dielectric width capacitor approach employs metal plates terminated with sharp corners to enhance local electric field and facilitate ready breakdown of a thin dielectric between the metal plates. The vertical MOSCAP array is composed of a capacitor array connected in series. Both approaches were simulated, fabricated, and experimentally characterized in GlobalFoundries 22 nm fully depleted silicon-on-insulator. Vertical MOSCAP arrays detect ESD events starting from about 6 V with about 6 V granularity, while the variable dielectric width capacitor is suitable for detection of high ESD voltage from about 40 V and above.

DESCRIPTION

I. Introduction

Electrostatic discharge (ESD) in integrated circuits (ICs) occurs due to electrostatic charge transfer between two components in close proximity. As a result of an ESD event, a high transient current (e.g., up to a few tens of Amps) and a large voltage (e.g., up to several tens of kV) can develop between the two components. This fast (e.g., about 150 ns) transient phenomenon can cause serious damage or degrade the performance of affected ICs. Damage from an ESD event can cause local damage to metals, oxides, junctions, and other device components, resulting in either complete or partial device failure. ESD events significantly contribute to device failure at all stages of IC production, test, assembly, and field usage. About 35% of the IC field returns are reported to be ESD induced, with annual costs estimated to be several billions of dollars. ESD protection circuits are included in various ICs. Nonetheless, static charge accumulation during transport and handling can exceed the limits of a protection network, causing ESD damage.

With the advent of heterogeneous integration, bare dies from a variety of sources are to be integrated using advanced packaging methods such as the silicon interconnect fabric technology or fan-out wafer level packaging. During die transportation from a variety of sources, ESD events may occur. An accurate ESD sensor can allow pinpointing the occurrence of an ESD event prior at any point in the supply chain and potentially avoid the assembly of parts that may have been compromised due to ESD events.

In this disclosure, an on-chip ESD detection circuit, which can track the electrostatic history of the IC from the manufacturing process until the end-of-life, is proposed. This on-chip ESD sensor tracks the unit process module (assuming that testing is possible and performed after each unit process) that suffered an ESD event. The general criteria of an ESD detection circuit include: (i) stand alone or readily incorporated with heterogeneous dies, (ii) non-volatile, e.g., damage or effects of charge accumulation cannot be reset, modified, or erased, (iii) quantitative and correlated to the pad size, and (iv) detect ESD events independent of the packaging unit process, including storage. Two approaches for on-chip ESD evaluation are proposed: (a) variable dielectric width capacitor, and (b) vertical MOS capacitor (MOSCAP) array.

The following is composed of the following sections. The variable dielectric width capacitor is presented in Section II. Vertical MOSCAP array is presented in Section III. Conclusions are presented in Section IV.

II. Variable Dielectric Width Capacitor

The basic working principle of the variable dielectric width capacitor is presented in Section II A. Evaluation of the electric field within the proposed structure, and ESD test simulations are provided in Section II B. Implementation of the variable dielectric width capacitor in GlobalFoundries (GF) 22 nm fully depleted silicon-on-insulator (FDSOI) technology, along with the experimental results is presented in Section II C.

A. Working Principle

Figure 2:
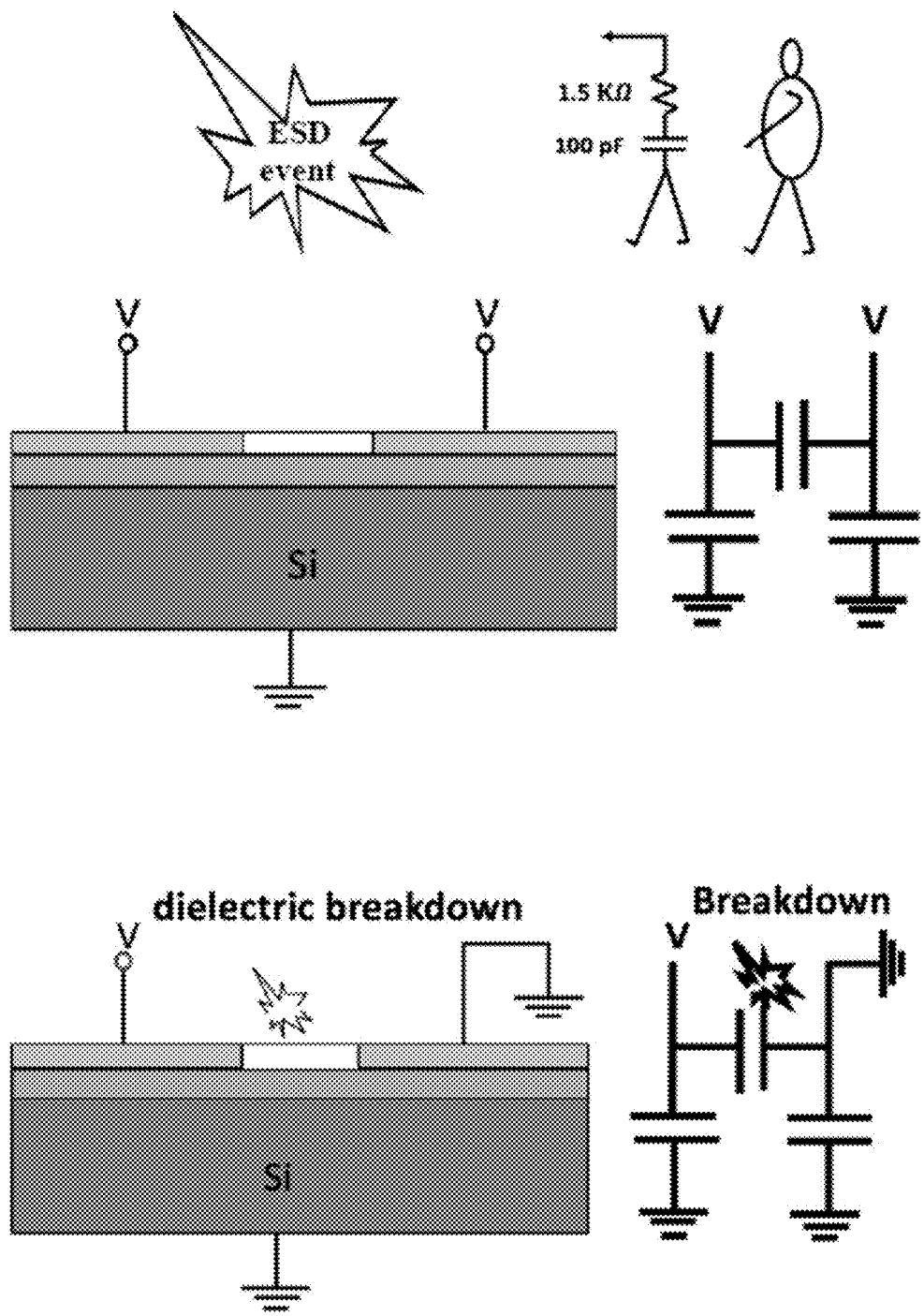

The basic structure of the variable dielectric width capacitor includes metal plates (serving as metal pads) terminated with sharp corners, as shown in FIG. 1. Sharp corners are incorporated in this structure to increase the local electric field intensity that will ensure that the thin dielectric between the metal plates breaks down readily. The ESD sensor module includes rows and columns populated with metal plate pairs of varying area and separation. Each plate pair i has a pad area of $A_i$ and a separation of $d_i$. The structure is subjected to ESD events during the packaging, assembly, or any other unit processing (FIG. 2). Since both metal pads in each pair are of substantially equal area, hence substantially equal capacitance, charge accumulation on the pads will be similar. If charge has accumulated on the metal pads, grounding one of the pads will cause a significant voltage difference between them. Consequently, a large current will flow from the high potential plate to the grounded plate through the thin dielectric causing a dielectric breakdown. The voltage that is developed across a plate pair i, denoted $V_i$, is directly proportional to the area of the plate $A_i$. The magnitude of the electric field $E_i$ that is developed between the metal pads, when one of the plates is grounded, depends on the plate separation $d_i$. The breakdown strength of the dielectric is denoted by $E_{BD,i}$. The criterion for breakdown is $E_i(V_i, d_i) > E_{BD,i}$, namely, the electric field between the metal pads becomes greater than the breakdown strength of the thin dielectric. In mission mode, one of the metal pads from each single pair in the array is always grounded, resulting in a breakdown of metal plate pairs with corresponding dielectric thickness whenever an ESD event occurs. The I-V curve of each plate pair (all rows and columns) can be measured at any time to observe whether an ESD event has occurred. The induced ESD voltage of the unit process is estimated by identifying the broken plate pairs. A more accurate evaluation of the induced voltage can be performed by increasing the granularity of ($A_i$ and $d_i$) within the array.

B. Evaluation of Electric Field and ESD Simulations

Figure 3:
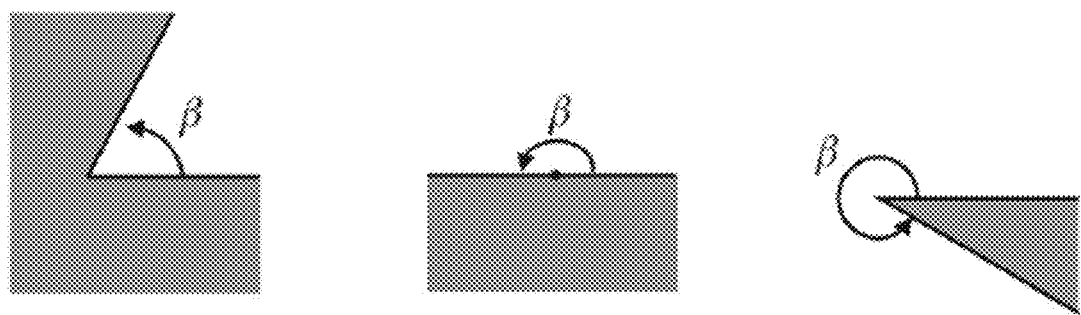

The electric field $E(\rho,\phi)$, in cylindrical coordinates (p, φ, z), inside a two-dimensional wedge with angle $\beta(0\le\phi\le\beta)$ bounded by a grounded conductor, provides insight into the nature of electric fields near sharp conducting corners (FIG. 3). When the radial distance p is small, the potential near the corner is given by $$\varphi(\rho, \phi) \approx \rho^{\pi/\beta}\sin\left(\frac{\pi\phi}{\beta}\right).$$

The associated electric field is $$E = -\nabla\varphi = -\frac{\pi}{\beta}\rho^{\frac{\pi}{\beta}-1}\left\{\hat{\rho}\sin\left(\frac{\pi\phi}{\beta}\right) + \hat{\phi}\cos\left(\frac{\pi\phi}{\beta}\right)\right\}.$$

Thus, the magnitude of the electric field $|E|\to 0$ as $\rho\to 0$, for $\beta<\pi$, and $|E|\to$infinity as $\rho\to 0$, for $\beta>\pi$. The intensity of a high local electric fields near sharp corners is exploited in the implementation of the variable dielectric width capacitor. When one of the metal plates in a plate pair is grounded, the charge density on the non-grounded plate near the sharp edge becomes high, resulting in a very high electric field, which can break down the dielectric between the plates.

Figure 4:
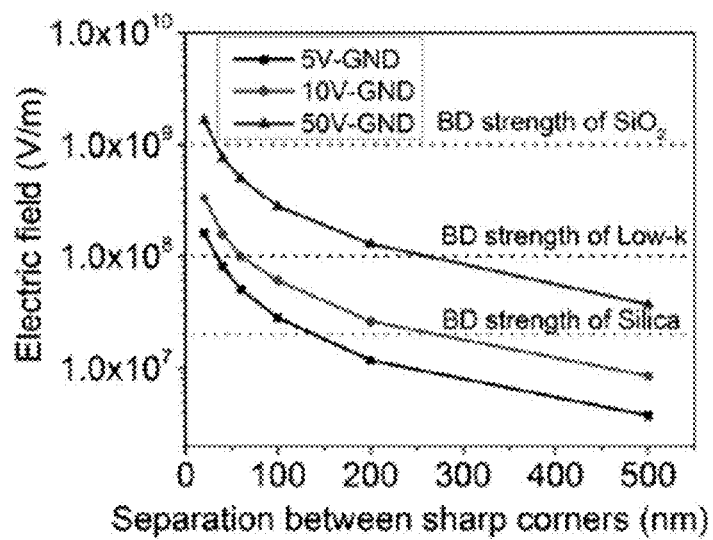
Figure 4:
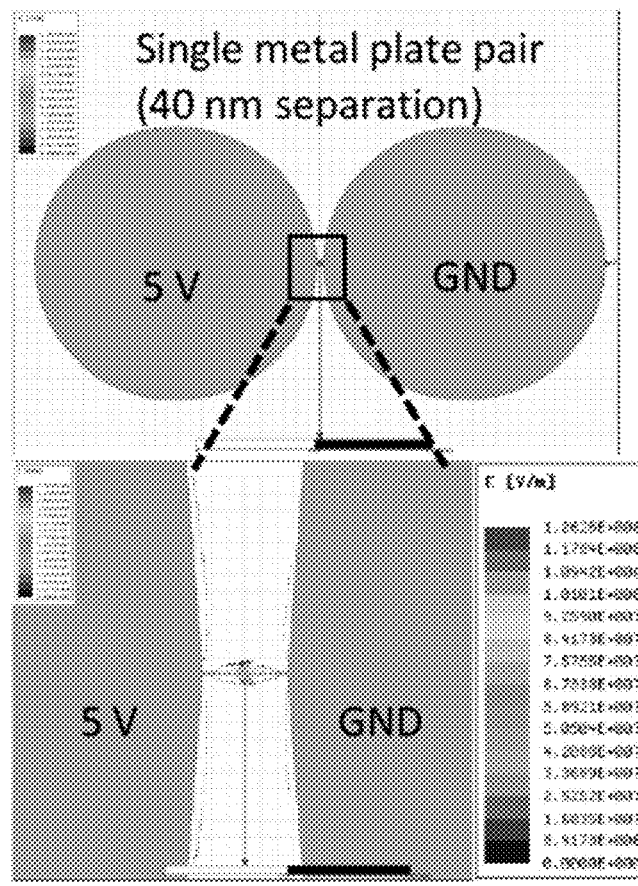

Electric field simulation of the structure in ANSYS Maxwell as a function of the width of the dielectric between the pads (namely, separation between sharp corners), is shown in FIG. 4. Breakdown strength of some dielectric materials that can be employed in the ESD sensor are also indicated in FIG. 4. For example, the maximum electric field between metal plates that are separated by about 40 nm of dielectric material is about $1.2\cdot 10^8$ V/m. If, therefore, the dielectric chosen for the about 40 nm separation is silica, exhibiting a typical breakdown strength of about $1\cdot 10^7$ V/m, a voltage of about 5 V across the plate pair will suffice to break the silica dielectric.

Classically, damage originating in ESD was considered to be a production problem, and was addressed by ESD safe procedures, like earth mats, operator wrist straps, and so forth. However, with increased use of plastic and synthetic materials in the modern environment and widespread use of metal oxide technologies, the effect of ESD on electronic systems has become more significant and is no longer considered as solely a production problem. ESD induced field returns of ICs during assembly, test, and field usage has led to the development of ESD testing standards to test for robustness and ensure ESD protection of any electronic equipment. For ESD qualification of ICs, test standards have been developed by various organizations, including JEDEC, ESDA, and MIL-STD. There are three main ESD test models based on ESD events that the test is emulating: human body model (HBM), charge device model (CDM), and machine model (MM).

Figure 5:
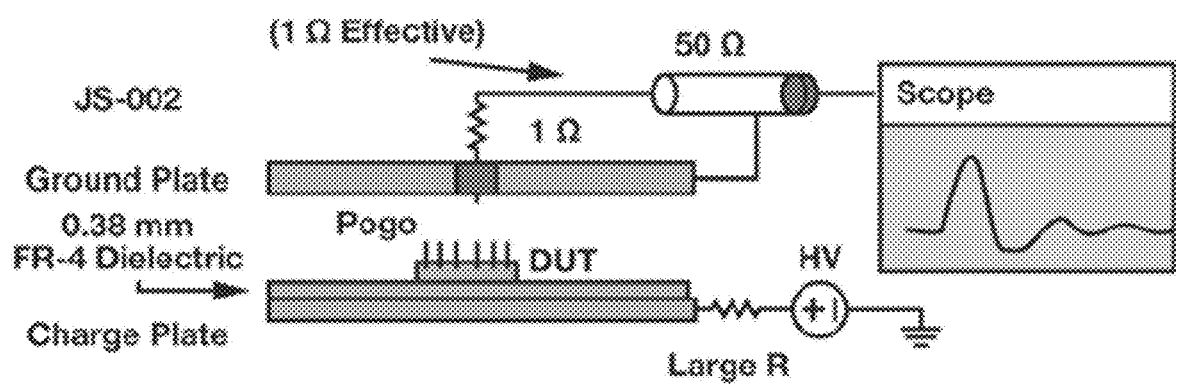

CDM emulates ESD charging followed by a rapid discharge, similar to what is seen in automated handling, manufacturing, and assembly of IC devices. A CDM calibration setup, as shown in FIG. 5, includes a charge plate, to which a high voltage supply is attached. A thin insulation layer (FR4 dielectric) isolates the device under test (DUT) from the charge plate. The DUT is placed on the insulation layer with its pins facing up. This results in the DUT being capacitively coupled through the FR4 dielectric and charged by the charge plate. During the test, a grounded plate approaches the DUT and discharges the current through an about 1Ω resistor. The discharge current through the resistor is monitored by an oscilloscope. JEDEC specifies a standard size metal coin for calibration of the test setup. The test environment from FIG. 5 was modelled in ANSYS Maxwell using an about 25 mm standard size coin as the DUT. All capacitances pertaining to the test setup were extracted. A CDM circuit simulation was performed with the extracted capacitance values, and the discharge current and voltage waveforms were verified with the literature reported values.

Figure 6:
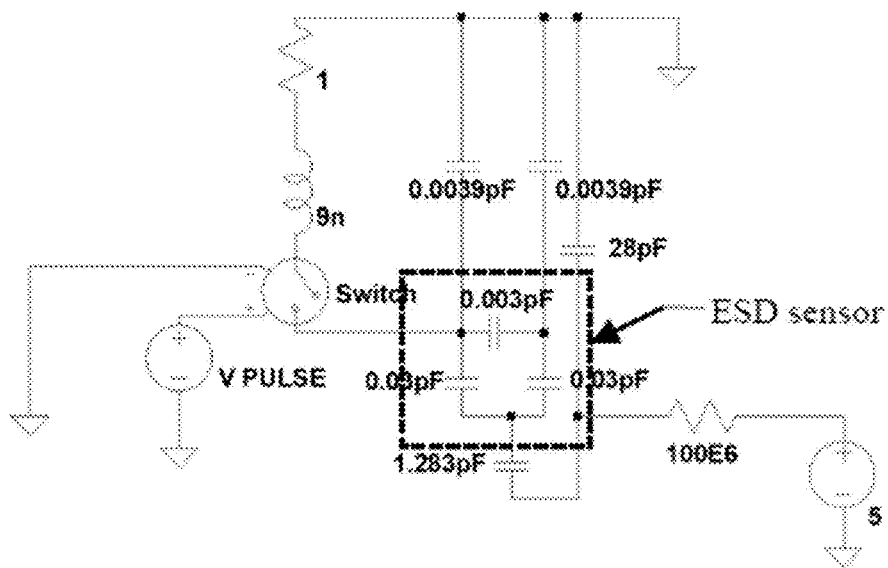
Figure 6:
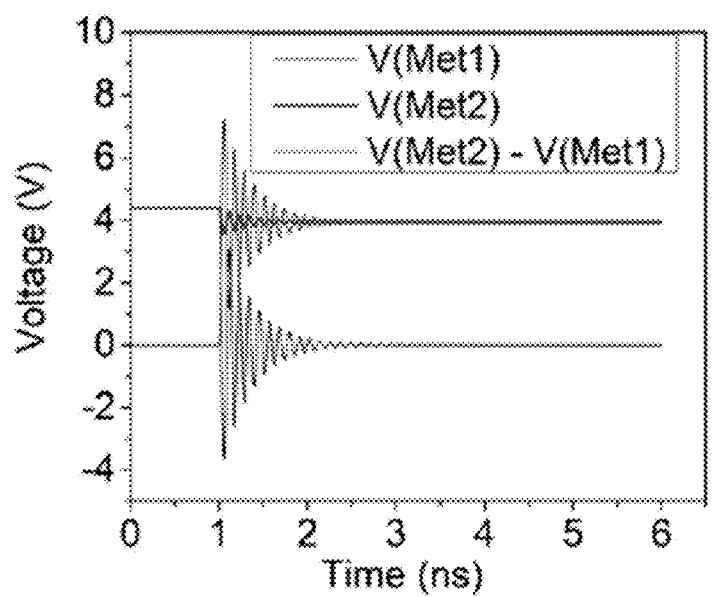

Upon verifying the test setup, a CDM simulation with the ESD sensor as the DUT was set up in ANSYS Maxwell and various capacitance values were extracted. CDM circuit schematic and simulation results with the ESD detector as the load are shown in FIG. 6. A test voltage of about 5 V is applied to the charge plate. Initially, both metal plates (Met1 and Met2) are equally charged to about 4.3 V. At t=1 ns, metal plate Met1 is grounded. Met1 undergoes a small oscillation and settles to 0 V. Prior to grounding Met1 (0≤t≤1 ns), the voltage difference between the two plates $V_{Met2}-V_{Met1}$ was zero. At t=1 ns, the difference in voltage shoots up to about 7 V and then settles to about 4 V. This shows the voltage development across the sharp corners, which results in a high local electric field and a possible dielectric breakdown between the metal plates when one of the metal plates is grounded.

Figure 7:
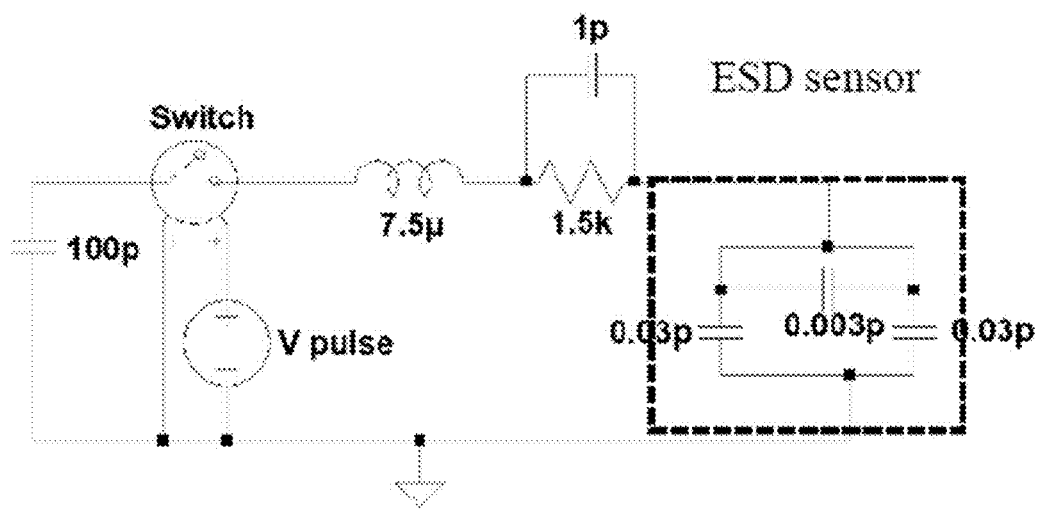
Figure 7:
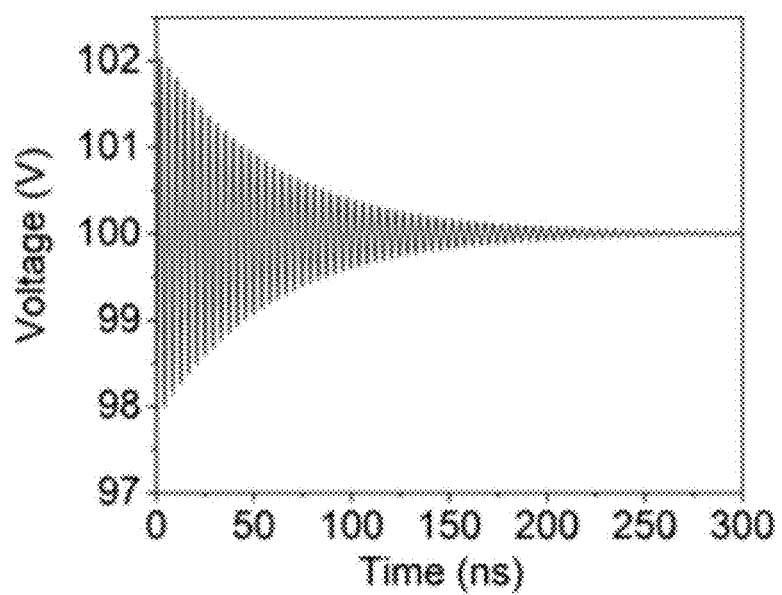

The HBM emulates an electrostatically charged human, touching the pins of an IC, typically generating a discharge current with a rise time of a few nanoseconds, and a decay time of about 150 ns. The small signal impedance of humans standing over a ground plane and holding a metal object varies non-linearly with frequency, from about 3 kΩ at low frequency (<about 1 MHz), to less than about 50 CI at high frequency (>about 1 GHz). This impedance can be modelled with discrete elements and transmission lines with good correlation to human ESD events. In case of an HBM ESD event, the static charge is initially stored in the body of the human, and transferred to the IC when a body part of the human comes in contact with the system. The equivalent circuit diagram of an HBM ESD event along with the ESD sensor as the DUT for an input test voltage of about 100 V is shown in FIG. 7. Both metal plates of the ESD sensor instantaneously (about 150 ns) acquire the applied voltage of about 100 V since the capacitance of the ESD sensor is significantly smaller than the typical HBM capacitance. This ensures that a breakdown occurs substantially instantaneously when one of the metal plates is grounded.

Figure 8:
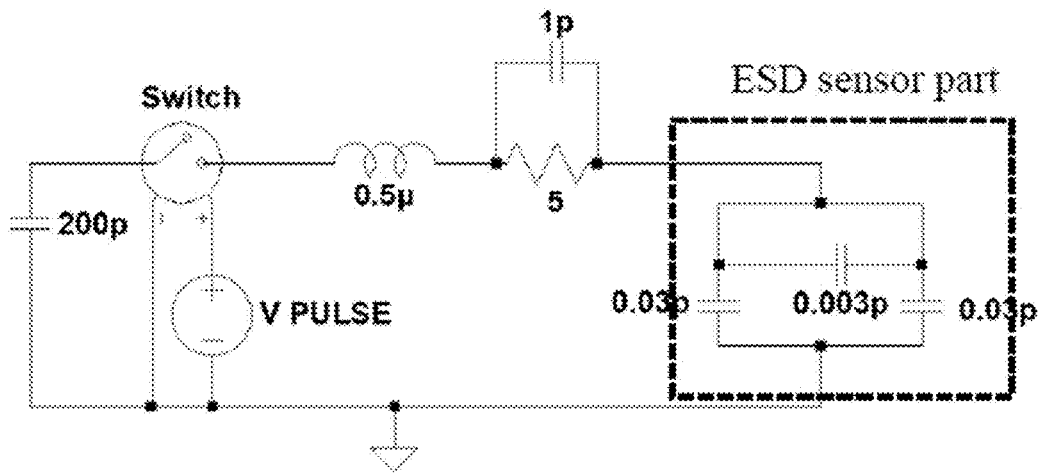
Figure 8:
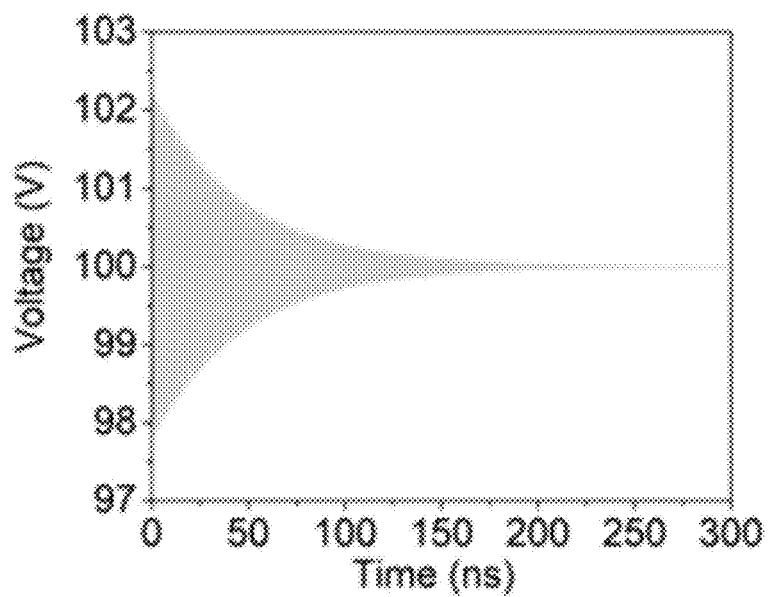

The MM ESD standard represents the electrical discharge from a charged conductive source into a component or an object. Unlike the HBM, the MM equivalent capacitor discharges through a small parasitic series resistance, resulting in an oscillatory input pulse. This is comparable to the pulse generated by a charged machine part touching an IC pin. MM simulation of the ESD sensor for an input voltage of about 100 V is shown in FIG. 8. Similar to the HBM simulation, both metal plates acquire the applied voltage substantially instantaneously, again ensuring that a breakdown would happen when one of the metal plates is grounded. All of the ESD simulations demonstrate the functionality of the ESD detector unit.

C. Fabrication in GF 22 nm FDSOI and Experimental Results

Figure 9:
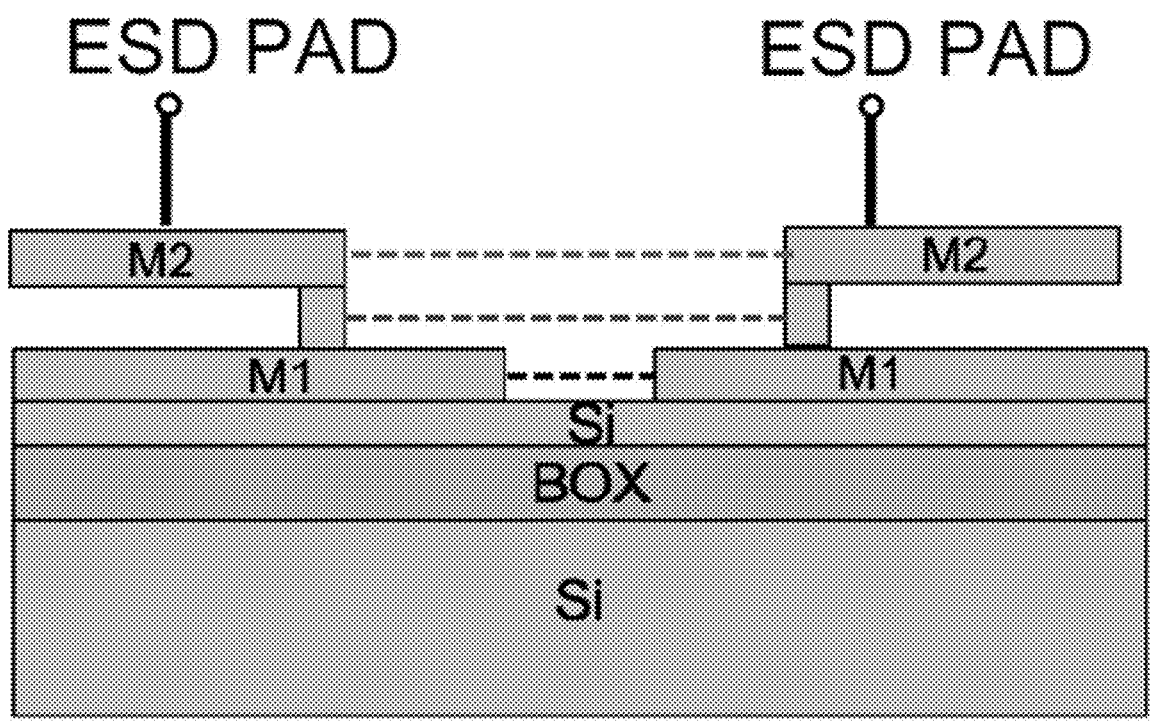
Figure 10:
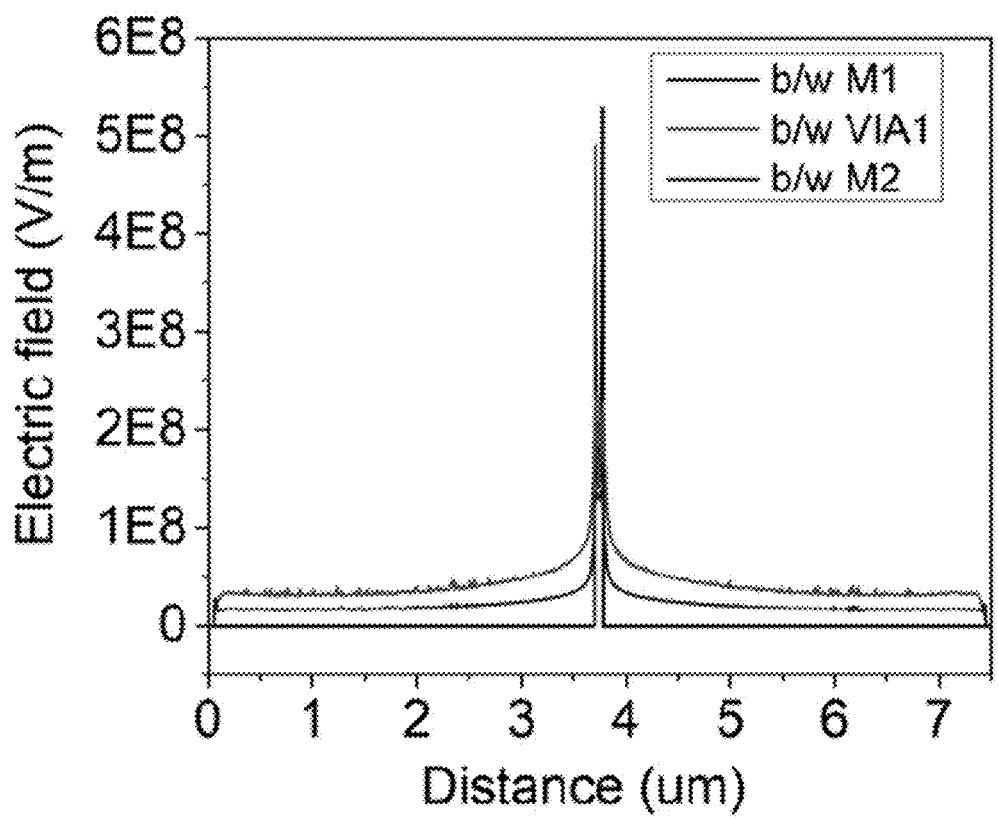

The variable dielectric width capacitor was designed, simulated, and fabricated using GF 22 nm FDSOI technology. Instead of sharp corners, rectangular shaped metal lines (constrained by the process technology) were used. The lowest metal line (M1) is used to specify the metal structure of the variable dielectric width capacitor. Electrical connection from M1 goes through vias and other higher metallic layers (M1, M2, and so forth) and is terminated at the top metal pad of the FDSOI technology, as shown in FIG. 9. The electric field simulation for the metal M1 lines separated by an about 80 nm dielectric is shown in FIG. 10. The electric field value is about $5 \cdot 10^8$ V/m for an applied voltage of about 20 V, which can cause a dielectric breakdown if the chosen thin dielectric is a low-k material. Note, the electric field between the M1 metal lines is not as high as for the simulated case of sharp corners since the metal lines, constrained by the process technology, are rectangular shaped.

Figure 11:
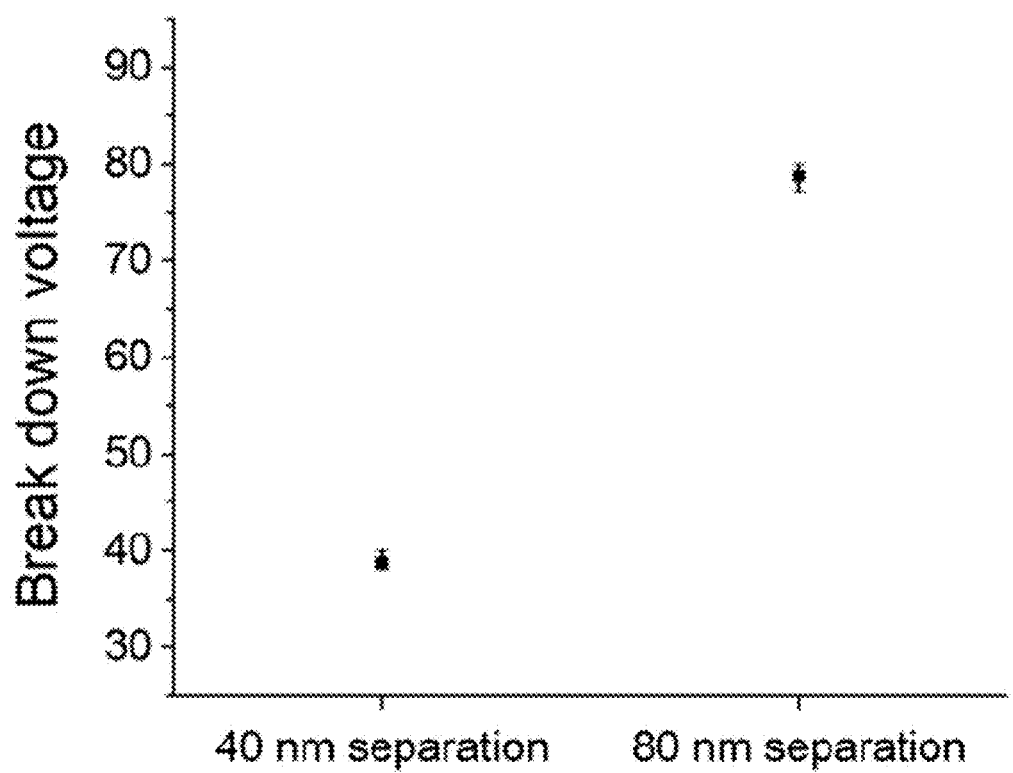

Two metal separations, about 40 nm and about 80 nm, are used in the GF 22 nm FDSOI implementation. For a silicon dioxide inter-layer dielectric exhibiting a breakdown strength of about 1 V/nm, a breakdown voltage of, respectively, about 40 V and about 80 V is determined. The variable dielectric width capacitor is experimentally characterized in two steps, first, both of the metal pads are grounded. This ensures that both metal pads are substantially equally charged, mimicking an ESD event, in this case to 0 V. In the second step of the characterization, the applied voltage is varied on one of the pads, while the other metal pad is grounded. The extracted I-V characterization allows identification of the breakdown voltage of the structure. The breakdown characteristics of the two implementations are shown in FIG. 11

Figure 12:
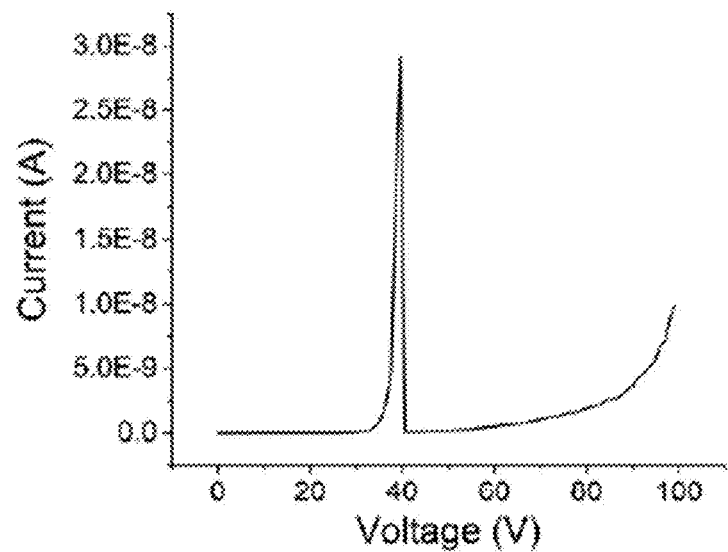
Figure 12:
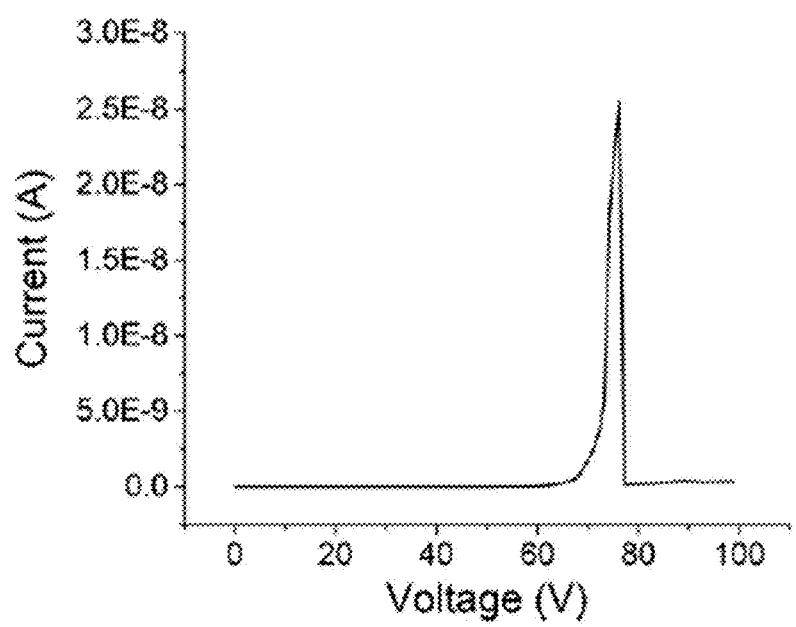

The about 40 nm dielectric width capacitor breaks down in the range of about 38 V to about 41 V, while the about 80 nm ESD sensor breaks down at a range of about 77 V to about 81 V. The extracted I-V characteristics of the two structures are shown in FIG. 12. Note, after breakdown, the current drops rapidly due to a possible accelerated electromigration or a thermally induced void formation in the metal lines caused by the high-power dissipation immediately after the breakdown event. To ensure that the ESD event is stored, the dielectric breakdown should be decoupled from generation of thermally induced voids and electro-migration within the metal interconnect, which can happen as a result of high current associated with the breakdown event. For example, the peak current for an about 40 V HBM event, assuming about 150 ns discharge time would be (100 pF·40)/150 ns=26 mA. The current carrying capability of the interconnect has to, therefore, be increased, for example, by adding more vias and increasing interconnect width to support 26 mA of current.

III. Vertical MOSCAP Array

The second on-chip ESD monitor approach is the vertical MOSCAP array. The MOSCAPs in the array are realized using metal-oxide-semiconductor field-effect transistors (MOSFETs) in the given technology. The working principle of the vertical MOSCAP array is outlined in Section III-A. Design and experimental results for vertical MOSCAP arrays in GF 22 nm FDSOI are shown in Section III-B.

A. Working Principle

Figure 13:
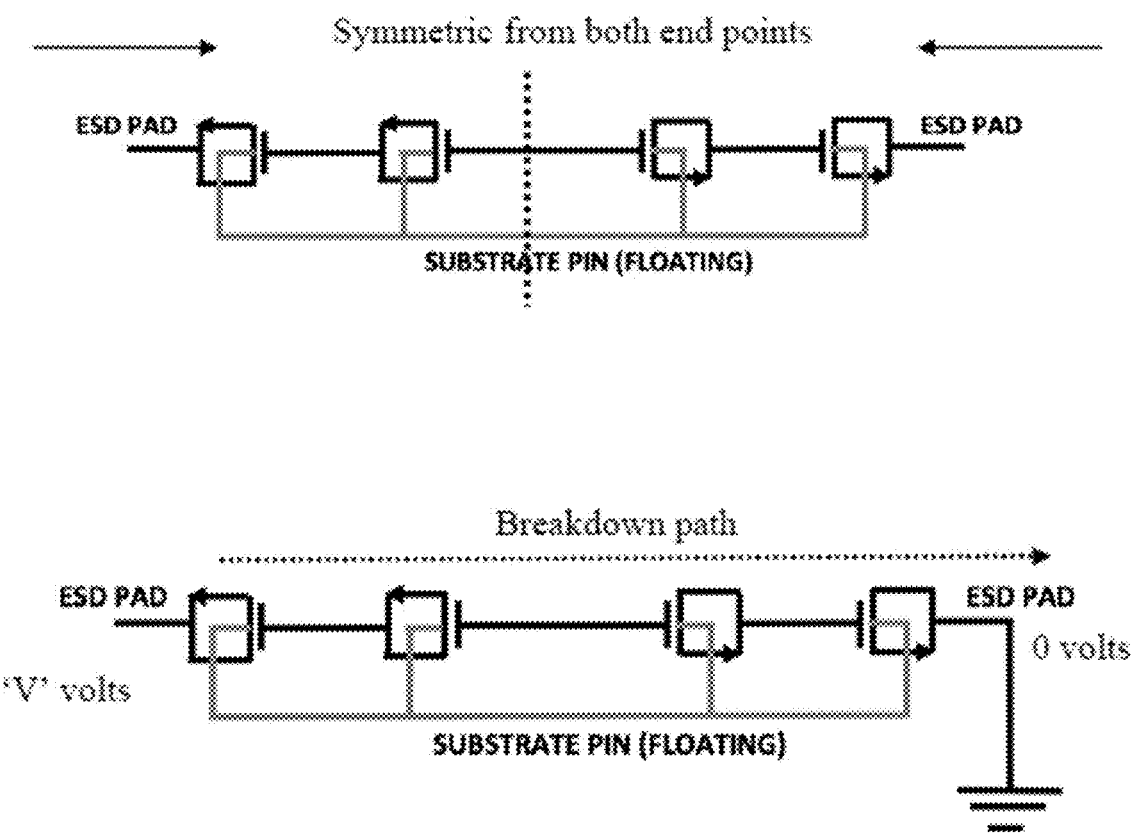

The basic structure includes an array of capacitors in series. Capacitors in the array are realized using MOSFETs. The gate of each MOSFET is used as one terminal and the source and drain, tied together, serve as the second terminal of the capacitor. The number of capacitors in each array is two or an integer multiple of two (2, 4, 6, 8, and so forth). The basic working principle of the vertical MOSCAP array is similar to that of the variable dielectric width capacitor (FIG. 13). Both terminals of the capacitor arrays are exposed to the outside, and are subjected to ESD events. As the array structure is symmetrical, charge accumulation (if any) would be substantially equal on both exposed pads. After any unit process, where a possible ESD event can occur, one of the exposed pads is grounded. A voltage difference is developed between the ungrounded and grounded pads. The voltage is divided equally across the capacitors within the array, as the individual capacitors are of substantially equal size (similar capacitance). Capacitor arrays with a smaller breakdown strength than the developed voltage, will undergo breakdown. In mission mode, similar to the variable dielectric width capacitor array, one of the ESD pads is always tied to the substrate, resulting in a breakdown of the corresponding transistor array, whenever an ESD event occurs. The induced ESD voltage is estimated by measuring the I-V curves of all the transistor arrays and identifying the transistor arrays where breakdown has occurred.

B. Fabrication in GF 22 nm FDSOI and Experimental Results

Figure 14:
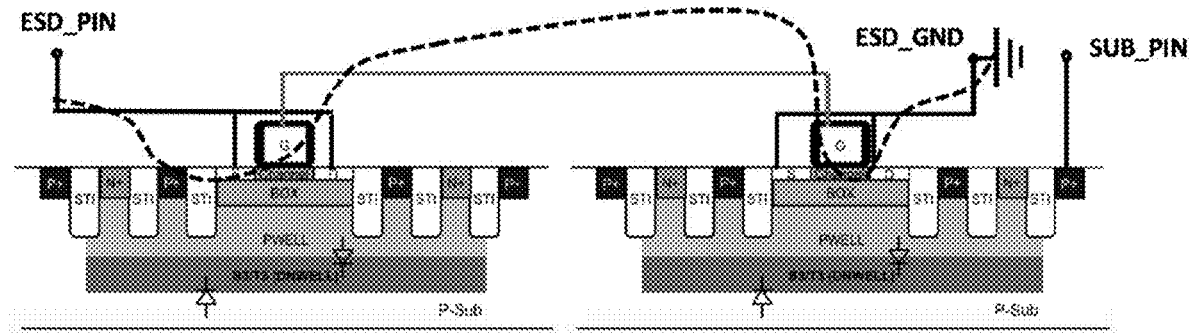
Figure 15:
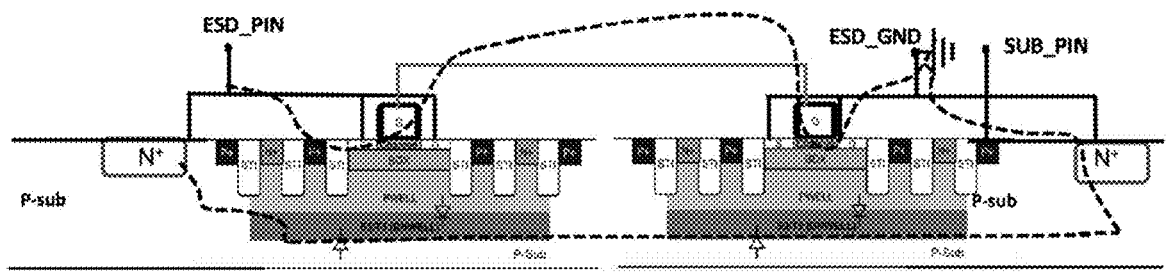

A schematic of the vertical MOSCAP array fabricated in GF 22 nm FDSOI is shown in FIG. 14. Here the capacitors are realized by using the gate as one terminal, and the source and drain, tied together, as the second terminal. The antenna rules provided with the technology, ensure that the voltage at the internal floating nodes of the circuit do not cause breakdown of the individual capacitors within the array. For example, use of higher metal levels (M1-M2-M1) to avoid a long single metal line (M1-M1-M1) in case of antenna violation. Antenna diodes are typically used at the I/O terminal pads and help to protect from breakdown of the gate oxide during fabrication by providing an alternate path for charge leakage (during plasma processing, sputtering, reactive-ion-etching, and so forth). However, antenna diode protection is not used at the terminals of the ESD monitor since adding the alternate path for breakdown (provided by the antenna diodes) defeats the purpose of the ESD detection circuit, as shown in FIG. 15. Thin and thick gate oxide transistors were used in the design of the MOSCAP arrays. The following arrays were included in the fabricated test chip: two thin oxide transistors (2T thin), two thick oxide transistors (2T thick), four thin oxide transistors (4T thin), four thick oxide transistors (4T thick), and six thick oxide transistors (6T thick), with determined breakdown voltages of, respectively, about 7 V, about 12 V, about 14 V, about 24 V, and about 36 V.

The experimental characterization of the MOSCAP array follows the same procedure as outlined for the variable dielectric width capacitor. In the first step, both terminal pads are grounded to zero volts. This emulates the ESD event which is common to both pads. In the second step, voltage is varied at one pad, keeping the other pad at ground until a breakdown is observed. The breakdown voltage is noted from the I-V curve. If both ESD pads were initially charged to a voltage greater than the breakdown voltage, as a result of any ESD event, then grounding one of the ESD pads would have resulted in immediate breakdown. Thus, the breakdown voltage of the structure is determined.

In general, an oxide film loses its insulating property in two steps. In the first step, traps are generated in the oxide that increase the leakage current through the oxide. The generation rate of traps depends on the type of dielectric. In case of high-k dielectrics stacked with interfacial Sift (similar to the one used in GF 22 nm FDSOI technology), since high-k dielectrics have higher bulk defect density than Sift, the generation rate of traps is higher as compared to an Sift-only dielectric of the same thickness. These traps can be the growth of an oxygen-deficient filament, facilitated by the grain boundaries of the overlaying high-k film. Eventually, these traps complete a percolation path through the oxide, bridging the two electrodes across the dielectric. Breakdown happens when the number of injected carriers in the dielectric reaches a threshold value. Power dissipation through the percolation path controls the second stage of the breakdown transient, which determines the post-breakdown conduction property of the oxide. A hard breakdown is characterized by a large change in voltage or current during the breakdown transient and a post-breakdown I-V characteristic that is essentially ohmic. The power dissipated during breakdown is high enough to melt silicon near the percolation spot and allow the molten silicon to flow through the oxide. This results in an ohmic short-circuit across the oxide, as the power dissipated exceeded the threshold of irreversible thermal damage. A soft breakdown is detected by a much smaller change of voltage or current after breakdown and by post-breakdown characteristics which can be described by a power law. The thermal damage in soft-breakdown is reversible.

Figure 16:
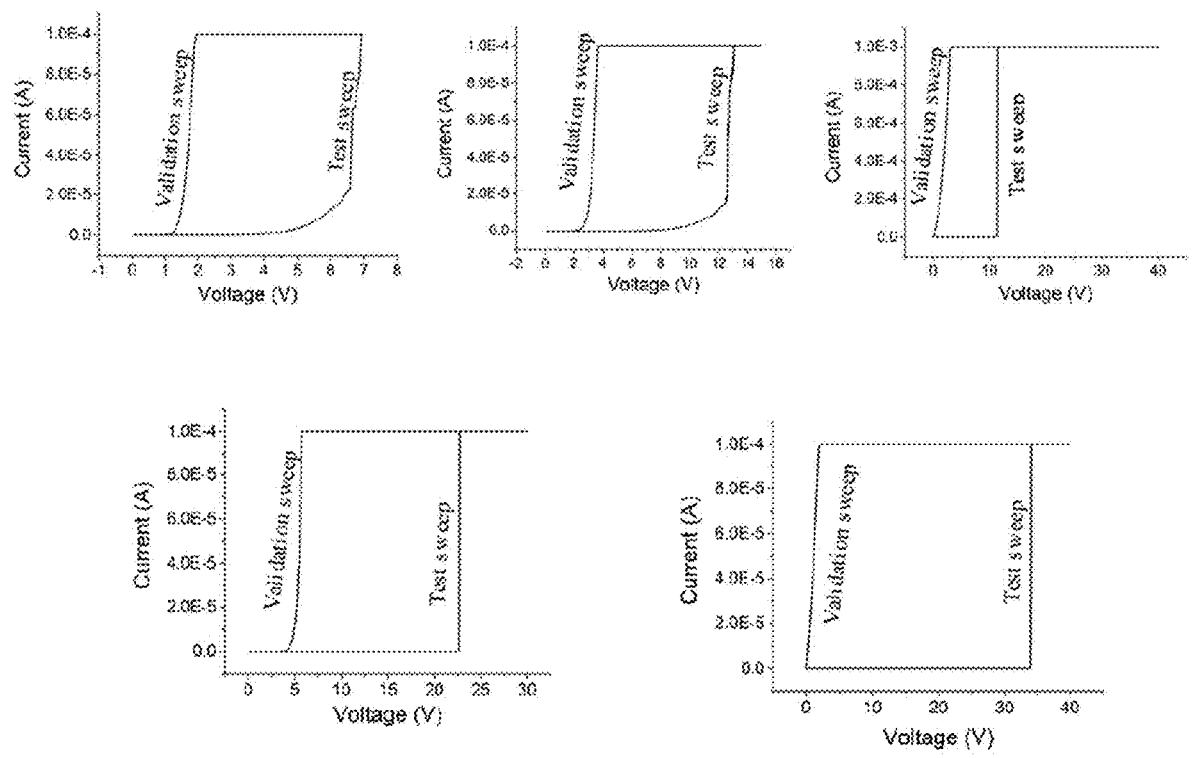
Figure 17:
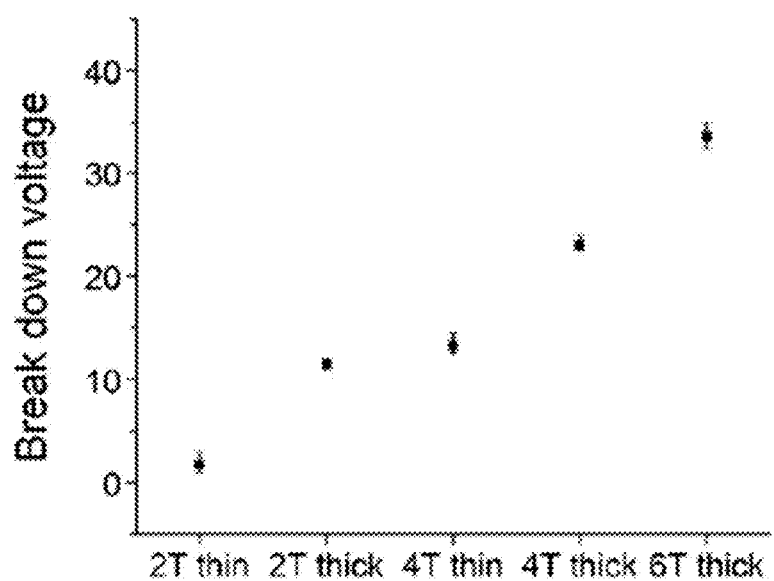
Figure 18:
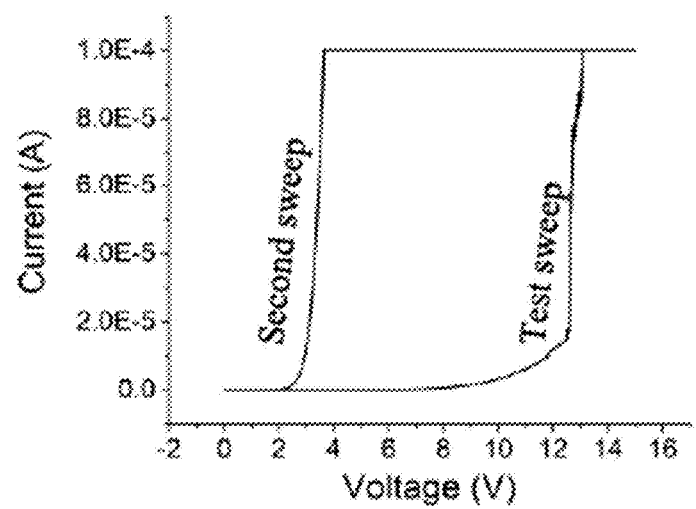
Figure 18:
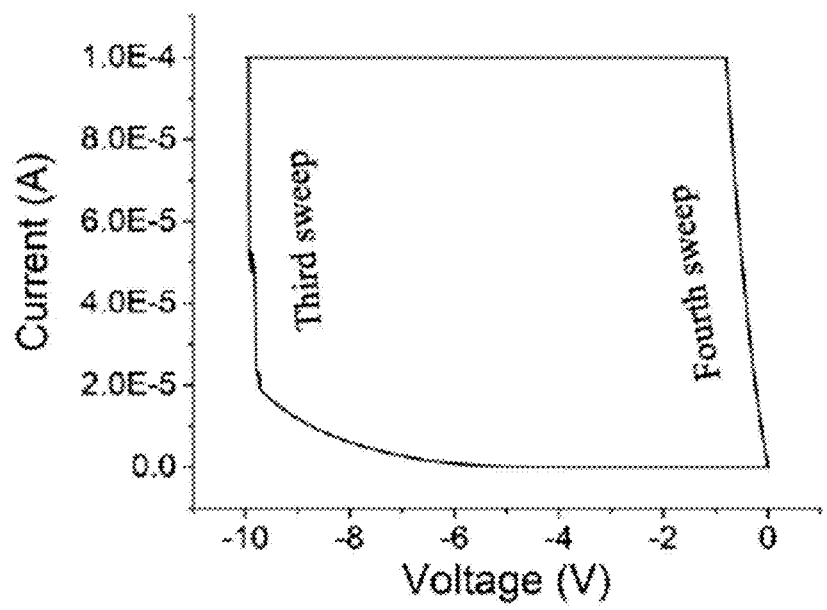

I-V characteristics of the five vertical MOSCAP array structures are shown in FIG. 16. A validation sweep is performed after the test sweep to ensure that breakdown has actually happened during the test sweep. Breakdown characteristics of the MOSCAP array are shown in FIG. 17. The 2T thin structure breaks down at about 6-7.5 V, 4T thin at about 12-14.5 V, 2T thick at about 11-12 V, 4T thick at about 22-24 V, and 6T thick at about 32-35 V. In some cases, with the 2T thin oxide and 4T thin oxide arrays, after a test sweep of voltage in the positive direction, resulting in breakdown (confirmed by $2^{nd}$ sweep of voltage in positive direction), a $3^{rd}$ sweep in negative direction, results in another breakdown in the negative direction, as shown in FIG. 18. This possibly indicates that the oxide has undergone a soft breakdown in the positive voltage sweep, confirmed by the second (validation) voltage sweep. A percolation path is created as a result of the positive sweep soft breakdown. When the voltage is swept in the reverse direction (third sweep in the negative direction), the traps which were created in the first soft breakdown reconfigure, resulting in a recovery of the oxide, since the soft breakdown is reversible. The oxide then undergoes another breakdown in the negative voltage sweep direction. However, this behavior is not observed for the high voltage detection MOSACP arrays (4T thick and 6T thick), as the high voltage/current during the breakdown results in higher power dissipation, ensuring a hard breakdown during the first test sweep.

IV. Conclusions

Two approaches for an on-chip ESD detector are proposed. Variable dielectric width capacitor is suitable for high voltage detection. The lower threshold of voltage detection using variable dielectric width capacitor is constrained by the minimum metal separation supported by the given technology (about 40 nm in case of GF 22 nm FDSOI). This method is area efficient since transistors are not used in the implantation of the variable dielectric width capacitor. The second approach, vertical MOSCAP arrays, is suited for low voltage detection. The granularity in ESD voltage level detection can be tuned by using thin and thick gate oxide devices. For high voltage detection that specifies a large number of transistors, however, this approach becomes area inefficient.

The proposed prototypes, variable dielectric width capacitor and vertical MOSCAP array can be included in a variety of dies, manufactured by using a variety of processes to provide ESD monitoring during packaging, as well as assembly and transport.

V. Example Embodiments

A. First Aspect

In a first aspect according to some embodiments, an electrostatic discharge detection circuit is provided in an integrated circuit, and includes: a pair of conductive plates and a dielectric disposed between the pair of conductive plates, a first one of the pair of conductive plates includes a body portion and an elongated portion extending from the body portion towards a second one of the pair of conductive plates, and the second one of the pair of conductive plates includes a body portion and an elongated portion extending from the body portion towards the first one of the pair of conductive plates.

In some embodiments, an area of the first one of the pair of conductive plates is substantially equal to an area of the second one of the pair of conductive plates.

In some embodiments, a terminal end of the elongated portion of the first one of the pair of conductive plates and a terminal end of the elongated portion of the second one of the pair of conductive plates are spaced by a separation distance. For example, the separation distance is a non-zero value in a range of 0 nm to about 500 nm.

In some embodiments, the pair of conductive plates is a first pair of conductive plates, and the electrostatic discharge detection circuit includes an array of pairs of conductive plates including the first pair of conductive plates, and the dielectric is disposed between each pair of conductive plates in the array.

In some embodiments, the array includes a second pair of conductive plates, a first one of the second pair of conductive plates includes a body portion and an elongated portion extending from the body portion towards a second one of the second pair of conductive plates, and the second one of the second pair of conductive plates includes a body portion and an elongated portion extending from the body portion towards the first one of the second pair of conductive plates.

In some embodiments, (i) an area of the first one of the first pair of conductive plates is substantially equal to an area of the second one of the first pair of conductive plates, and is denoted as $A_1$; (ii) an area of the first one of the second pair of conductive plates is substantially equal to an area of the second one of the second pair of conductive plates, and is denoted as $A_2$; and (iii) $A_1$ is different from $A_2$. For example, $A_2$ is at least about 1.1 times, at least about 1.2 times, or at least about 1.3 times $A_1$.

In some embodiments, (i) a terminal end of the elongated portion of the first one of the first pair of conductive plates and a terminal end of the elongated portion of the second one of the first pair of conductive plates are spaced by a separation distance $d_1$; (ii) a terminal end of the elongated portion of the first one of the second pair of conductive plates and a terminal end of the elongated portion of the second one of the second pair of conductive plates are spaced by a separation distance $d_2$; and (iii) $d_1$ is different from $d_2$. For example, $d_2$ is at least about 1.1 times, at least about 1.2 times, or at least about 1.3 times $d_1$.

In some embodiments, each conductive plate includes, or is formed of, a metal, a metal alloy, or another conductive material.

B. Second Aspect

In a second aspect according to some embodiments, an integrated circuit is provided, and includes the electrostatic discharge detection circuit of any of the embodiments of the first aspect.

C. Third Aspect

In a third aspect according to some embodiments, a method of detecting an electrostatic discharge event in an integrated circuit is provided, where an electrostatic discharge detection circuit is provided in the integrated circuit, and includes: a pair of conductive plates and a dielectric disposed between the pair of conductive plates, a first one of the pair of conductive plates includes a body portion and an elongated portion extending from the body portion towards a second one of the pair of conductive plates, and the second one of the pair of conductive plates includes a body portion and an elongated portion extending from the body portion towards the first one of the pair of conductive plates. The method includes grounding the first one of the pair of conductive plates, and performing current-voltage measurements across the pair of conductive plates to identify any dielectric breakdown indicative of an electrostatic discharge event.

In some embodiments, the pair of conductive plates is a first pair of conductive plates, and the electrostatic discharge detection circuit includes an array of pairs of conductive plates including the first pair of conductive plates, and the dielectric is disposed between each pair of conductive plates in the array. The method includes grounding a first one of each pair of conductive plates, and performing current-voltage measurements across each pair of conductive plates to identify any dielectric breakdown indicative of an electrostatic discharge event, and to identify an extent of the electrostatic discharge event.

D. Fourth Aspect

In a fourth aspect according to some embodiments, an electrostatic discharge detection circuit is provided in an integrated circuit, and includes: a pair of conductive pads and an array of capacitors connected in series between the pair of conductive pads.

In some embodiments, a number of capacitors in the array is two or an integer multiple of two.

In some embodiments, the pair of conductive pads is a first pair of conductive pads, the array of capacitors is a first array of capacitors, and the electrostatic discharge detection circuit includes multiple pairs of conductive pads, including the first pair of conductive pads, and multiple arrays of capacitors, including the first array of capacitors, connected in series between respective ones of the multiple pairs of conductive pads.

In some embodiments, the electrostatic discharge detection circuit includes a second pair of conductive pads and a second array of capacitors connected in series between the second pair of conductive pads.

In some embodiments, (i) a number of capacitors in the first array of capacitors is two or an integer multiple of two; (ii) a number of capacitors in the second array of capacitors is two or an integer multiple of two; and (iii) the number of capacitors in the first array of capacitors is different from the number of capacitors in the second array of capacitors.

In some embodiments, (i) each capacitor in the first array of capacitors includes a dielectric having a first thickness; (ii) each capacitor in the second array of capacitors includes a dielectric having a second thickness; and (iii) the first thickness is different from second thickness. For example, the second thickness is at least about 1.1 times, at least about 1.2 times, or at least about 1.3 times the first thickness.

In some embodiments, each conductive pad includes, or is formed of, a metal, a metal alloy, or another conductive material.

In some embodiments, each capacitor includes a field-effect transistor including a gate, a source, and a drain, and the source is connected to the drain.

E. Fifth Aspect

In a fifth aspect according to some embodiments, an integrated circuit is provided, and includes the electrostatic discharge detection circuit of any of the embodiments of the fourth aspect.

F. Sixth Aspect

In a sixth aspect according to some embodiments, a method of detecting an electrostatic discharge event in an integrated circuit is provided, where an electrostatic discharge detection circuit is provided in the integrated circuit, and includes: a pair of conductive pads and an array of capacitors connected in series between the pair of conductive pads. The method includes grounding a first one of the pair of conductive pads, and performing current-voltage measurements across the array of capacitors to identify any dielectric breakdown indicative of an electrostatic discharge event.

In some embodiments, the pair of conductive pads is a first pair of conductive pads, the array of capacitors is a first array of capacitors, and the electrostatic discharge detection circuit includes multiple pairs of conductive pads, including the first pair of conductive pads, and multiple arrays of capacitors, including the first array of capacitors, connected in series between respective ones of the multiple pairs of conductive pads. The method includes grounding a first one of each pair of conductive pads, and performing current-voltage measurements across each array of capacitors to identify any dielectric breakdown indicative of an electrostatic discharge event, and to identify an extent of the electrostatic discharge event.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, an object provided "on," "over," "on top of," or "below" another object can encompass cases where the former object is directly adjoining (e.g., in physical contact with) the latter object, as well as cases where one or more intervening objects are located between the former object and the latter object.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. An electrostatic discharge detection circuit of an integrated circuit, comprising:
    a pair of conductive plates and a dielectric disposed between the pair of conductive plates,
    a first plate of the pair of conductive plates includes a body portion and an elongated portion extending from the body portion towards a second plate of the pair of conductive plates, and the second plate of the pair of conductive plates includes a body portion and an elongated portion extending from the body portion towards the first plate of the pair of conductive plates,
    wherein the elongated portion of the first plate and the second plate each comprise rectangular shaped metal lines.

2. The electrostatic discharge detection circuit of claim 1, wherein the pair of conductive plates is a first pair of conductive plates, and the electrostatic discharge detection circuit includes an array of pairs of conductive plates including the first pair of conductive plates, and the dielectric is disposed between each pair of conductive plates in the array.

3. The electrostatic discharge detection circuit of claim 2, wherein the array includes a second pair of conductive plates, a first plate of the second pair of conductive plates includes a body portion and an elongated portion extending from the body portion towards a second plate of the second pair of conductive plates, and the second plate of the second pair of conductive plates includes a body portion and an elongated portion extending from the body portion towards the first plate of the second pair of conductive plates.

4. The electrostatic discharge detection circuit of claim 3, wherein:
    (i) an area of the first plate of the first pair of conductive plates is substantially equal to an area of the second plate of the first pair of conductive plates, and is denoted as A1;
    (ii) an area of the first plate of the second pair of conductive plates is substantially equal to an area of the second plate of the second pair of conductive plates, and is denoted as A2; and
    (iii) A1 is different from A2.

5. The electrostatic discharge detection circuit of claim 3 or 4, wherein:
    (i) a terminal end of the elongated portion of the first plate of the first pair of conductive plates and a terminal end of the elongated portion of the second plate of the first pair of conductive plates are spaced by a separation distance d1;
    (ii) a terminal end of the elongated portion of the first plate of the second pair of conductive plates and a terminal end of the elongated portion of the second plate of the second pair of conductive plates are spaced by a separation distance d2; and
    (iii) d1 is different from d2.

6. An integrated circuit comprising the electrostatic discharge detection circuit of claim 1.

7. A method of detecting an electrostatic discharge event in an integrated circuit using the electrostatic discharge detection circuit of claim 1.

* * * * *